(12) United States Patent
Liu et al.

(10) Patent No.: US 9,218,987 B2
(45) Date of Patent: Dec. 22, 2015

(54) METHOD FOR TOP-SIDE COOLED SEMICONDUCTOR PACKAGE WITH STACKED INTERCONNECTION PLATES

(71) Applicant: Alpha and Omega Semiconductor Incorporated, Sunnyvale, CA (US)

(72) Inventors: Kai Liu, Mountain View, CA (US); François Hébert, San Mateo, CA (US); Lei Shi, Shanghai (CN)

(73) Assignee: ALPHA AND OMEGA SEMICONDUCTER INCORPORATED, Sunnyvale, CA (US)

(*) Notice: Subject to any disclaimer, the term of this patent is extended or adjusted under 35 U.S.C. 154(b) by 51 days.

(21) Appl. No.: 14/173,151

(22) Filed: Feb. 5, 2014

(65) Prior Publication Data

US 2014/0154843 A1    Jun. 5, 2014

Related U.S. Application Data

(60) Continuation of application No. 13/710,786, filed on Dec. 11, 2012, now abandoned, which is a division of application No. 12/326,065, filed on Dec. 1, 2008, now Pat. No. 8,354,740.

(51) Int. Cl.
*H01L 21/56* (2006.01)
*H01L 23/495* (2006.01)
(Continued)

(52) U.S. Cl.
CPC ............ *H01L 21/56* (2013.01); *H01L 21/50* (2013.01); *H01L 23/49524* (2013.01); *H01L 23/49562* (2013.01); *H01L 23/49568* (2013.01); *H01L 24/36* (2013.01); *H01L 24/40* (2013.01); *H01L 24/48* (2013.01); *H01L 2224/32245* (2013.01); *H01L 2224/37011* (2013.01); (Continued)

(58) Field of Classification Search
CPC ............ H01L 23/3107; H01L 23/3128; H01L 21/4871
USPC ........... 257/780, 685, 686, 678; 438/122, 123
See application file for complete search history.

(56) References Cited

U.S. PATENT DOCUMENTS 7,755,179 B2    7/2010    Carney et al.
2002/0074628 A1    6/2002    Mochizuku
(Continued)

*Primary Examiner* — Kenneth Parker
*Assistant Examiner* — Bo Fan
(74) *Attorney, Agent, or Firm* — Chein-Hwa S. Tsao; Chen-Chi Lin

(57) ABSTRACT

A top-side cooled semiconductor package with stacked interconnection plate is disclosed. The semiconductor package includes a circuit substrate with terminal leads, a semiconductor die atop the circuit substrate, a low thermal resistance intimate interconnection plate for bonding and interconnecting a top contact area of the semiconductor die with the circuit substrate, a low thermal resistance stacked interconnection plate atop the intimate interconnection plate for top-side cooling, a molding encapsulant for encapsulating the package except for exposing a top surface of the stacked interconnection plate to maintain effective top-side cooling. The top portion of the stacked interconnection plate can include a peripheral overhang above the intimate interconnection plate. The peripheral overhang allows for a maximized exposed top surface area for heat dissipation independent of otherwise areal constraints applicable to the intimate interconnection plate. The stacked interconnection plate can be partially etched or three dimensionally formed to create the peripheral overhang.

3 Claims, 17 Drawing Sheets

Present Invention

(51) Int. Cl.
*H01L 23/00* (2006.01)
*H01L 21/50* (2006.01)

(52) U.S. Cl.
CPC ............... *H01L 2224/40247* (2013.01); *H01L 2224/40249* (2013.01); *H01L 2224/48247* (2013.01); *H01L 2224/73263* (2013.01); *H01L 2924/01005* (2013.01); *H01L 2924/01006* (2013.01); *H01L 2924/01013* (2013.01); *H01L 2924/01027* (2013.01); *H01L 2924/01033* (2013.01); *H01L 2924/01075* (2013.01); *H01L 2924/01078* (2013.01); *H01L 2924/01079* (2013.01); *H01L 2924/01082* (2013.01); *H01L 2924/10329* (2013.01); *H01L 2924/1305* (2013.01); *H01L 2924/13055* (2013.01); *H01L 2924/13091* (2013.01); *H01L 2924/14* (2013.01); *H01L 2924/3011* (2013.01); *H01L 2924/30107* (2013.01)

(56) References Cited

U.S. PATENT DOCUMENTS

| | | | |
|---|---|---|---|
| 2004/0169289 A1* | 9/2004 | Satou et al. | 257/780 |
| 2006/0156737 A1* | 7/2006 | Liu et al. | 62/3.2 |
| 2008/0265326 A1* | 10/2008 | Hebert | 257/355 |

* cited by examiner

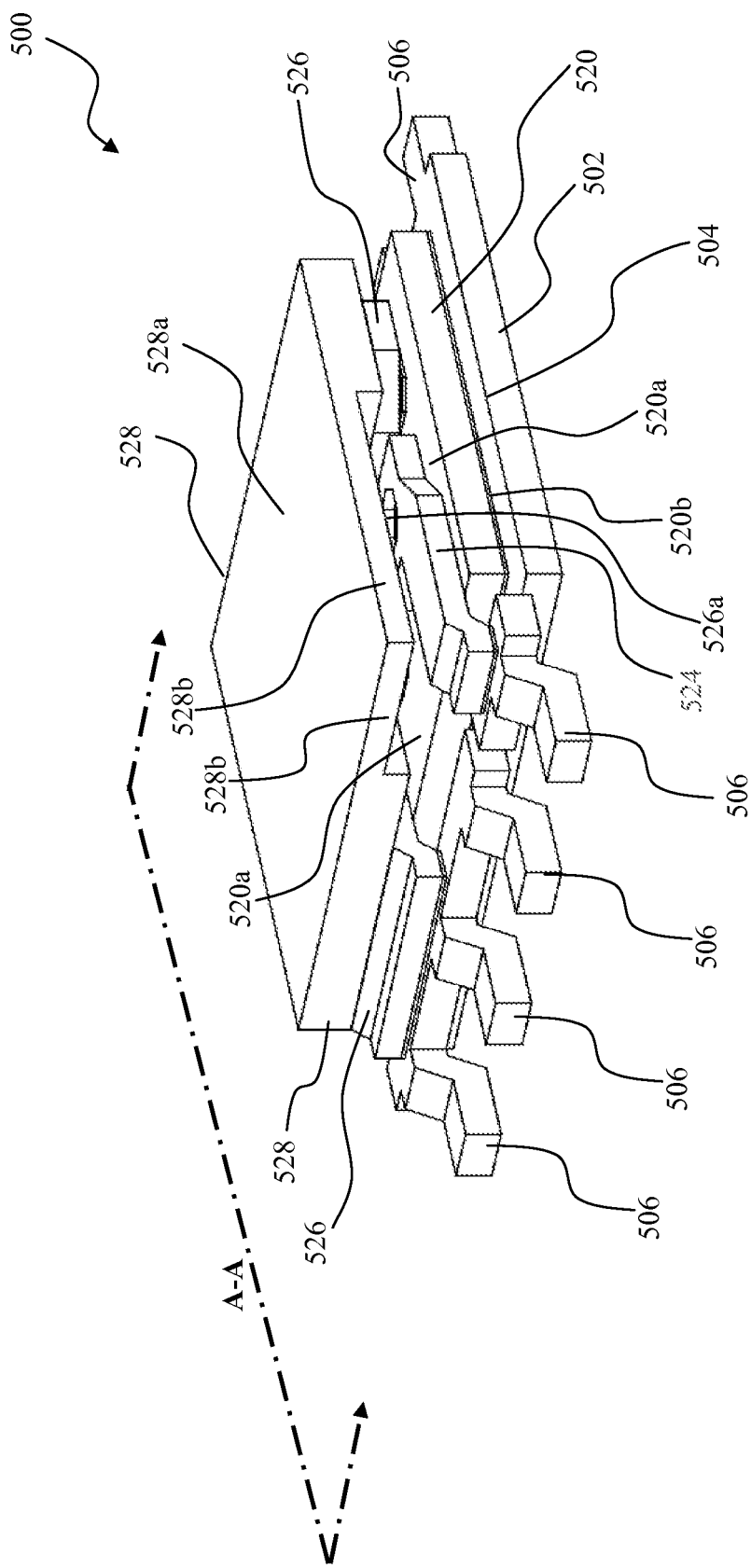
Fig. 5A  Present Invention

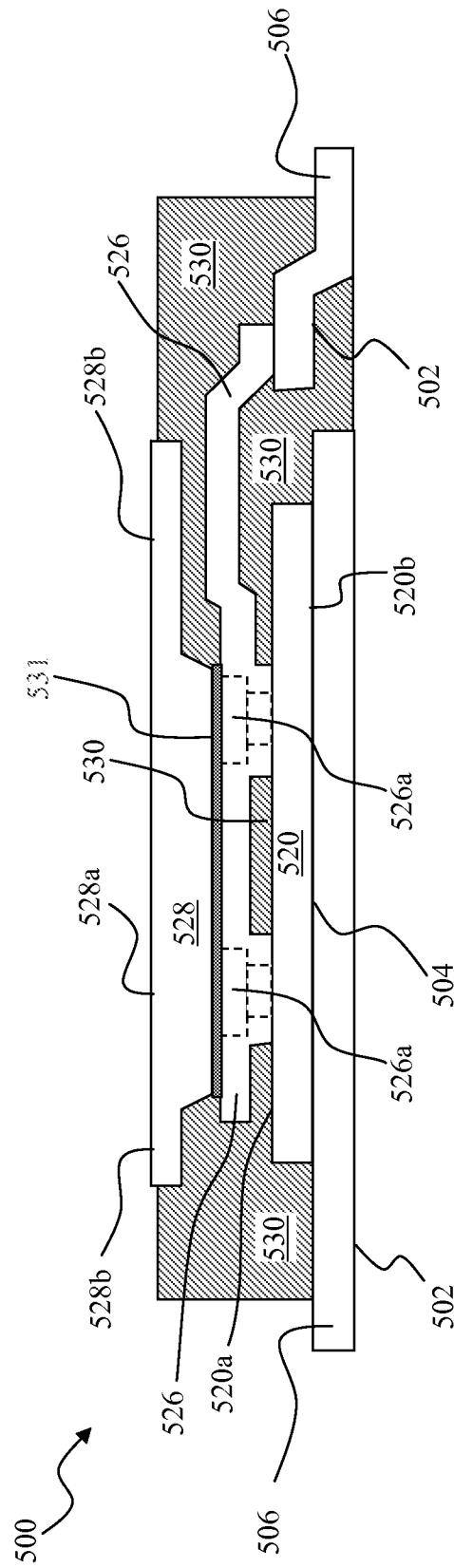
Fig. 5B Present Invention View A-A

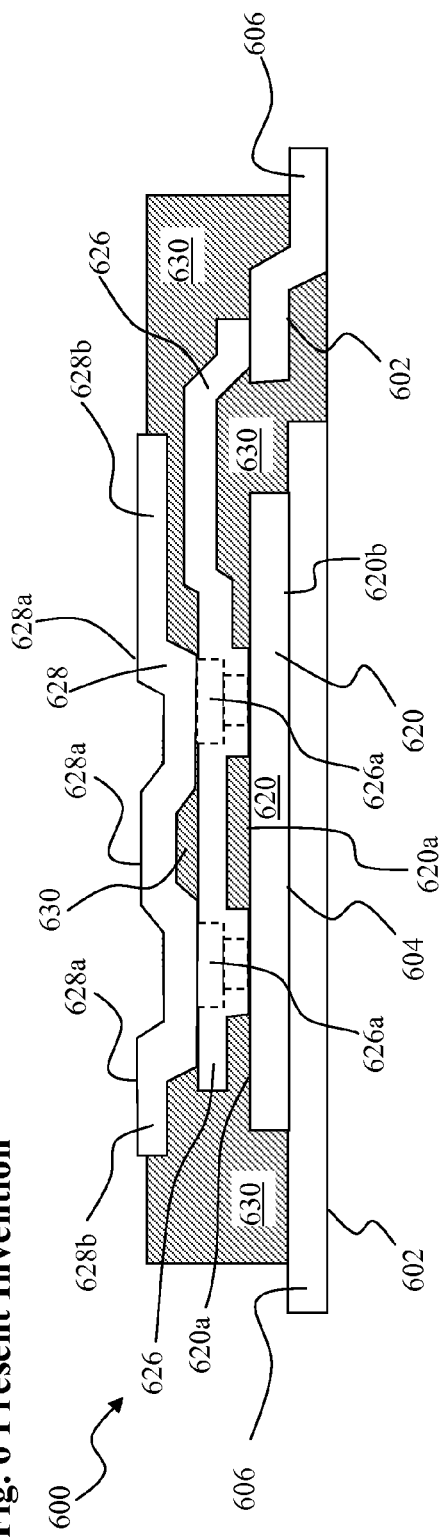

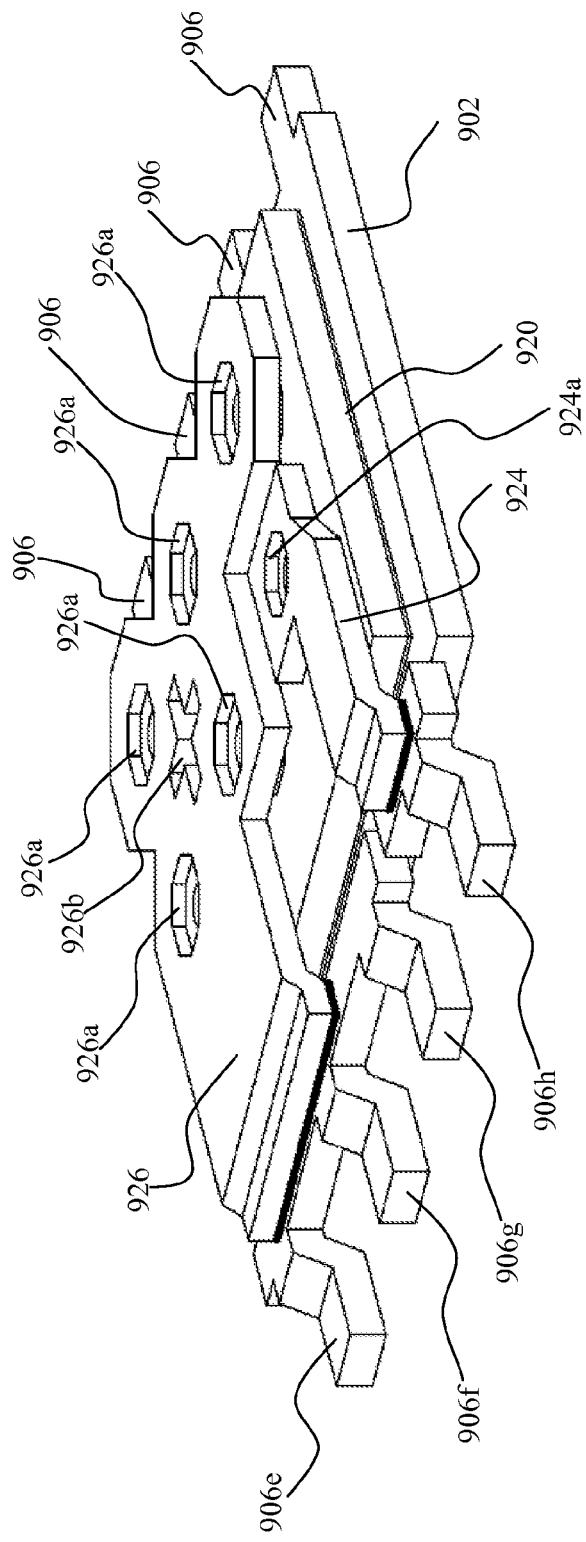
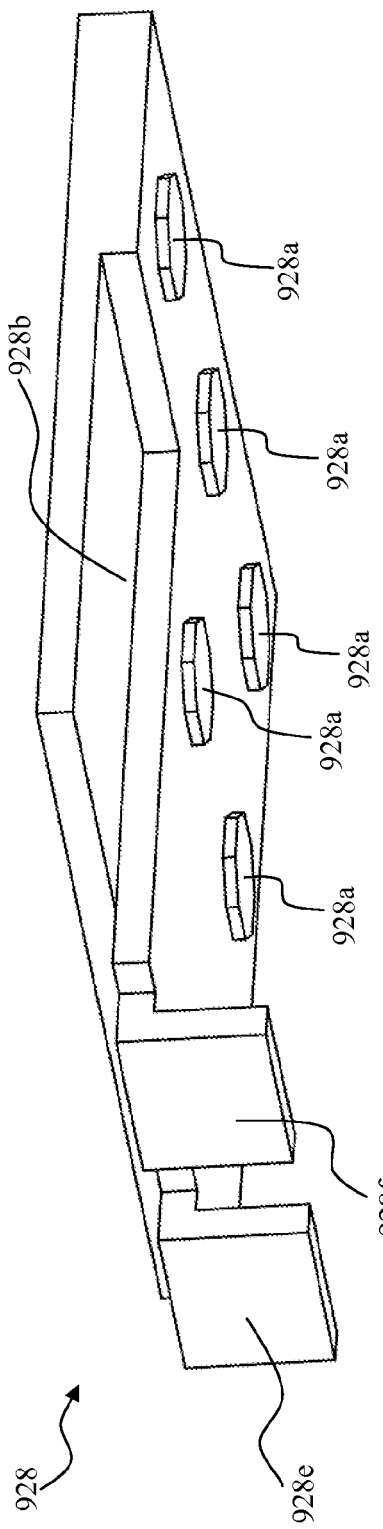
Fig. 8A Present Invention
Fig. 8B Present Invention

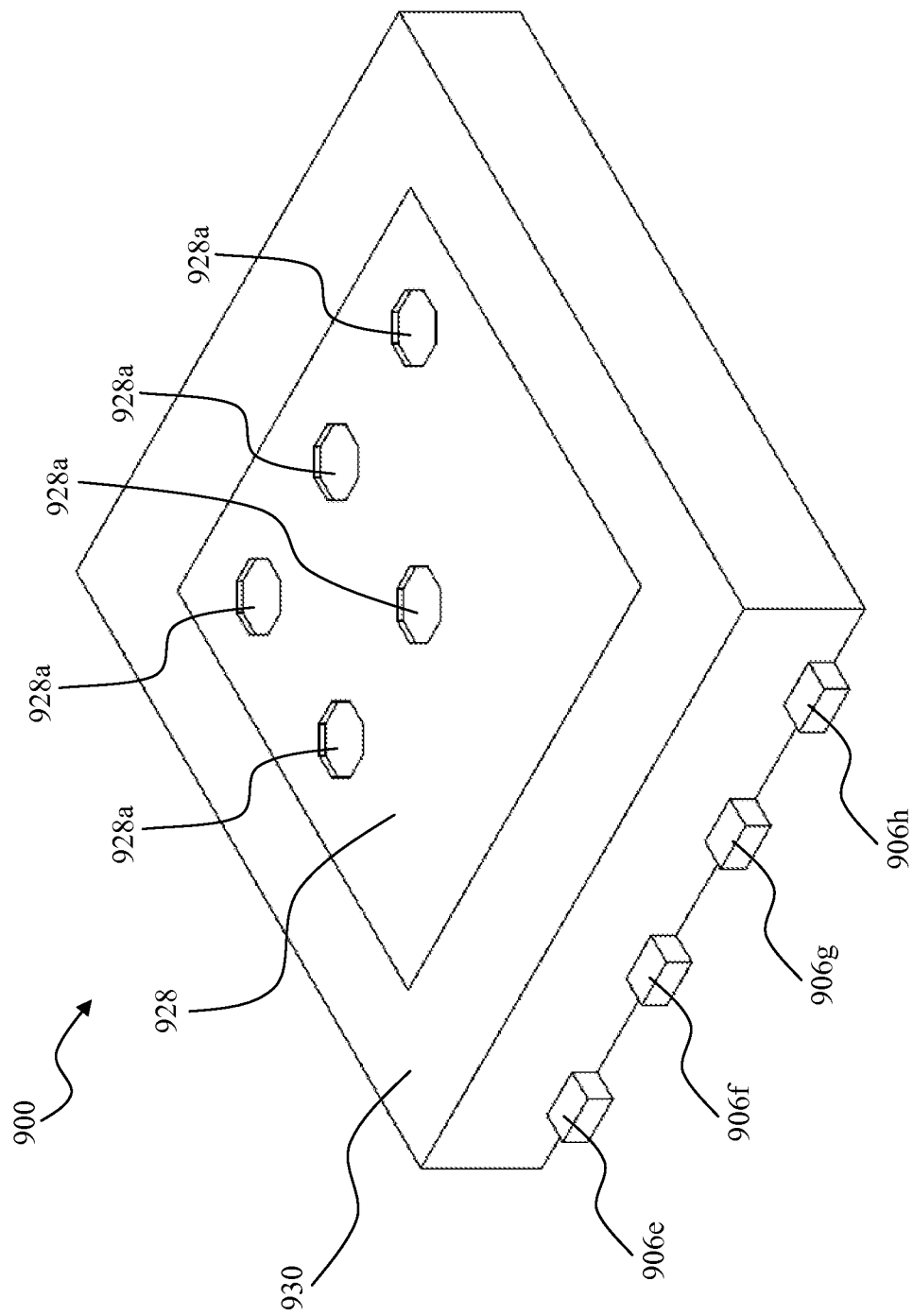
Fig. 8C Present Invention

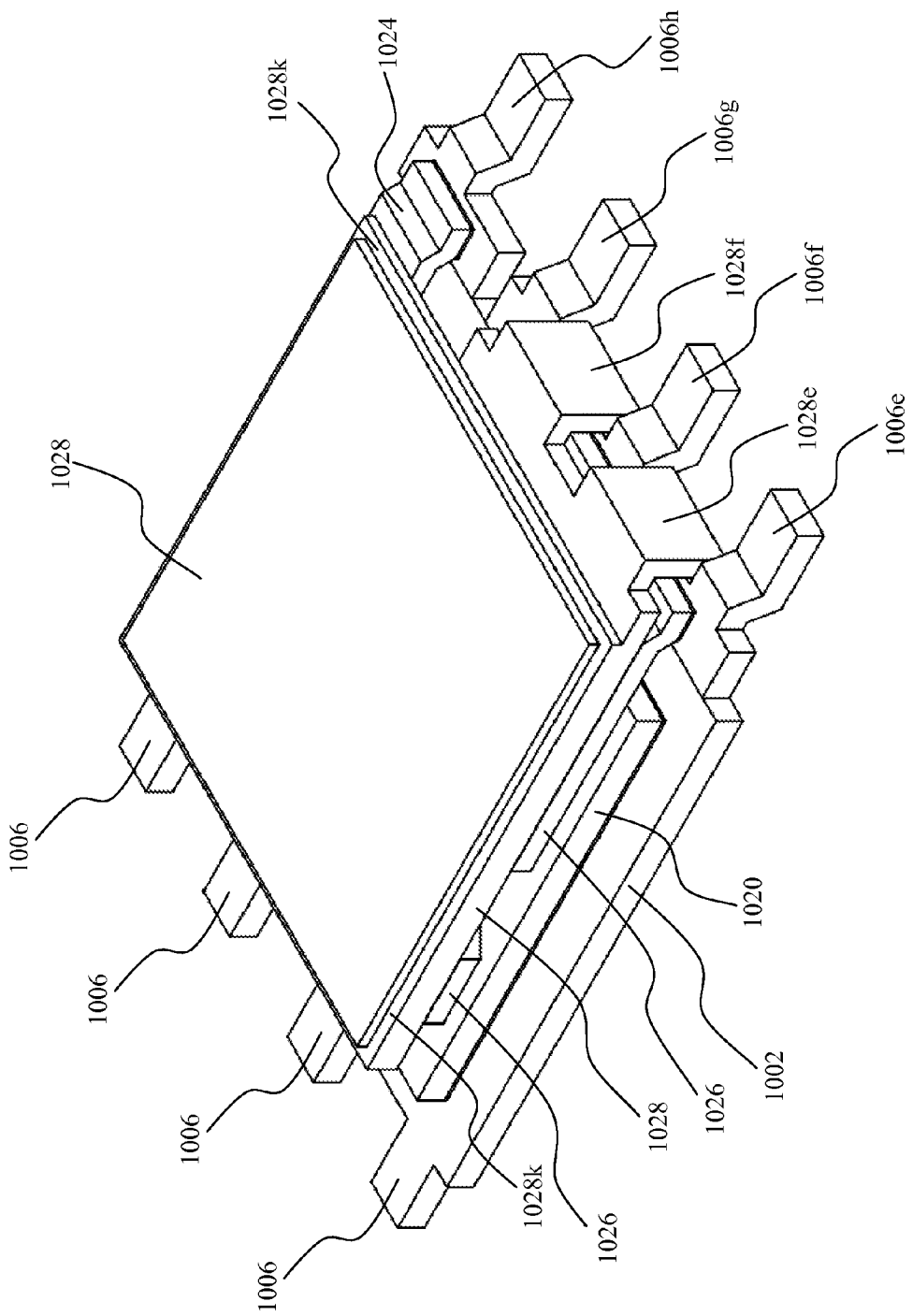
Fig. 9A Present Invention

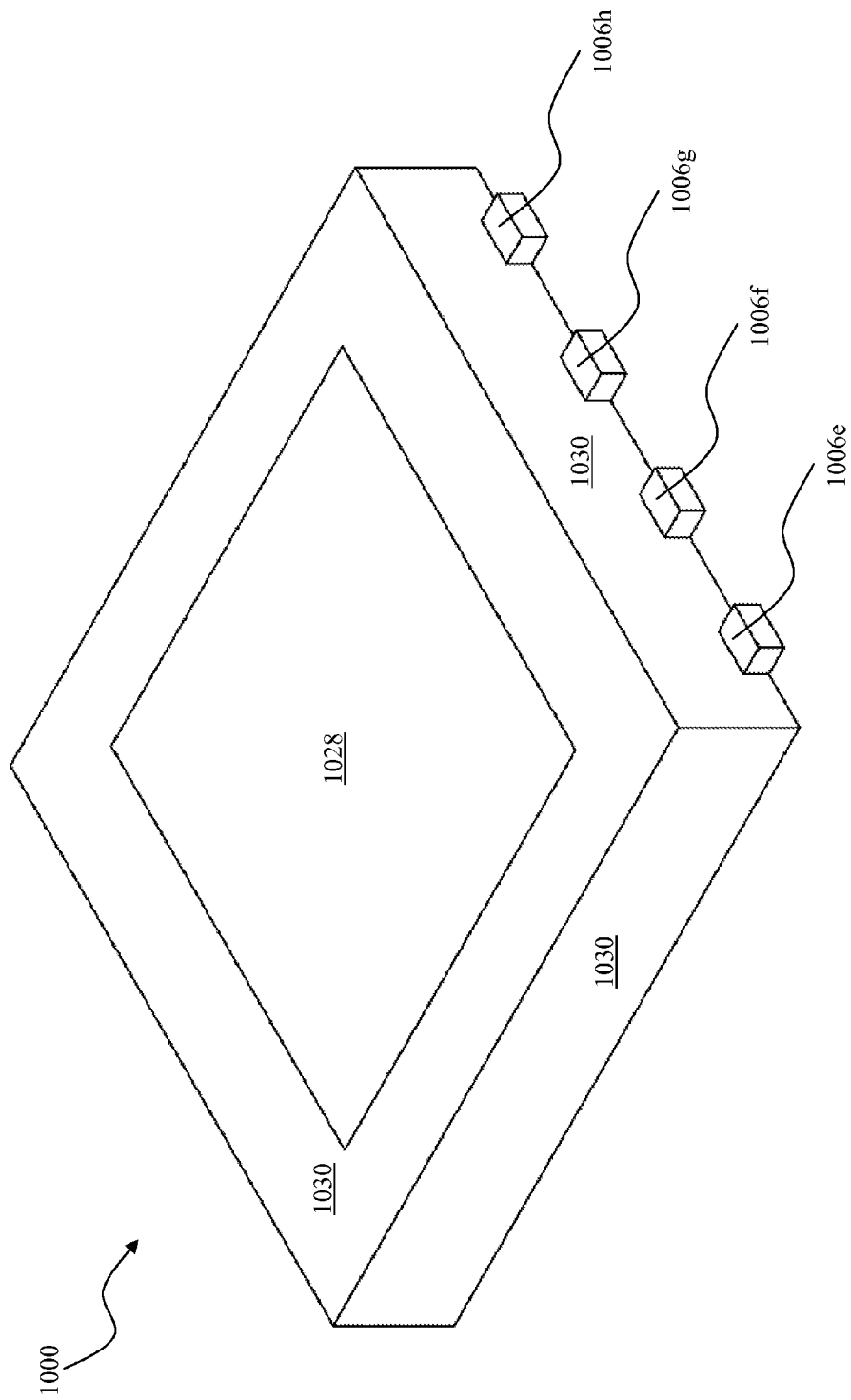
Fig. 9B Present Invention

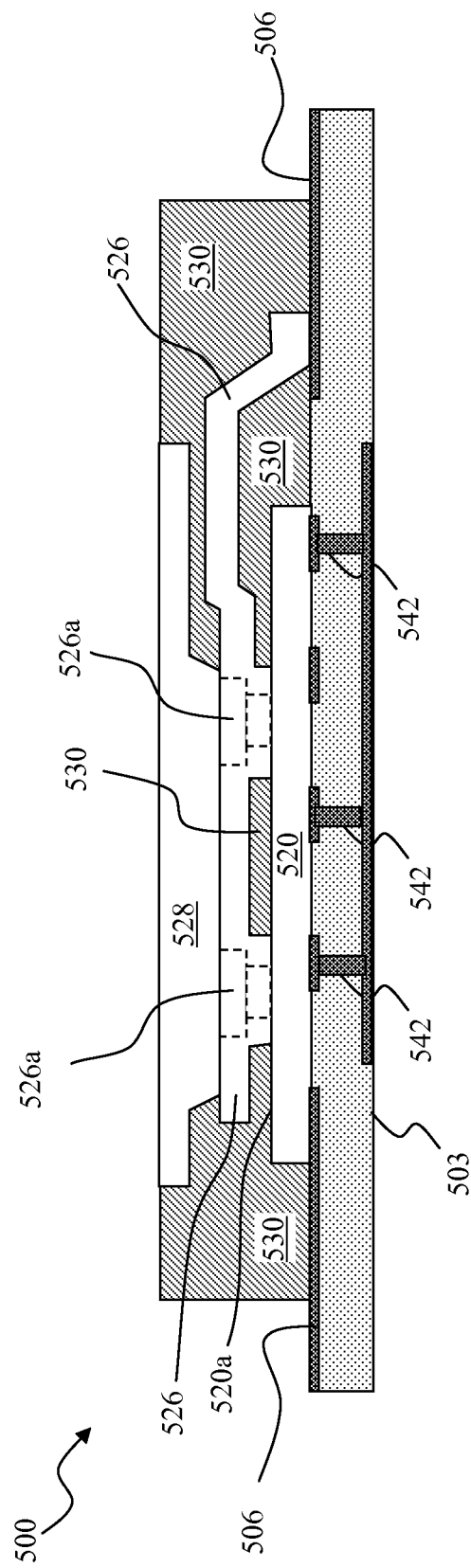
Fig. 10 Present Invention

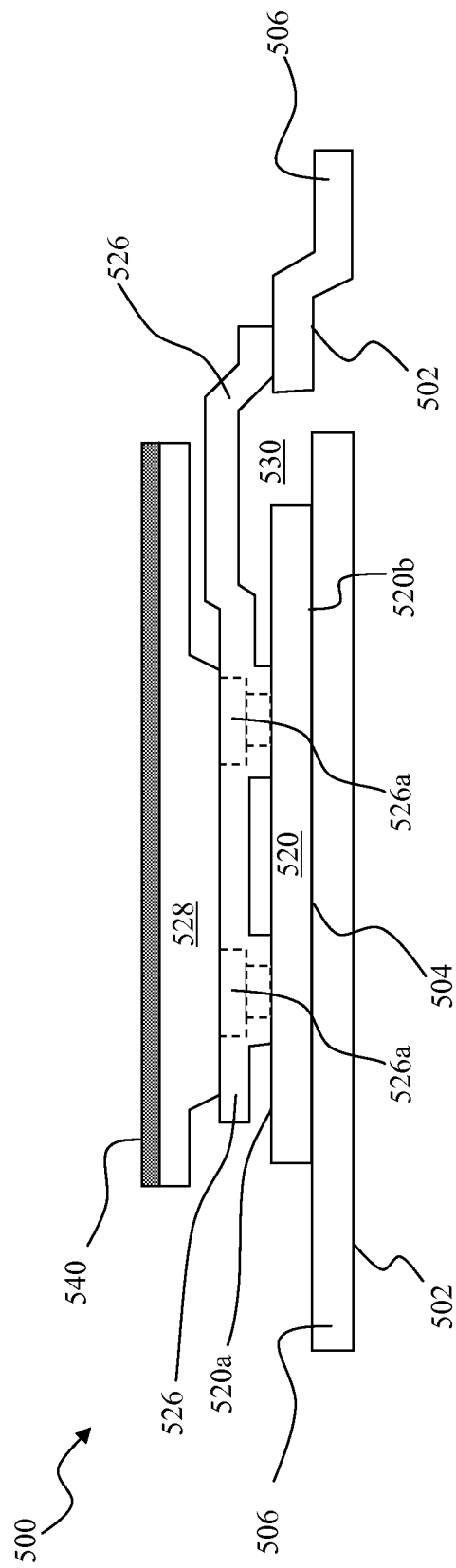

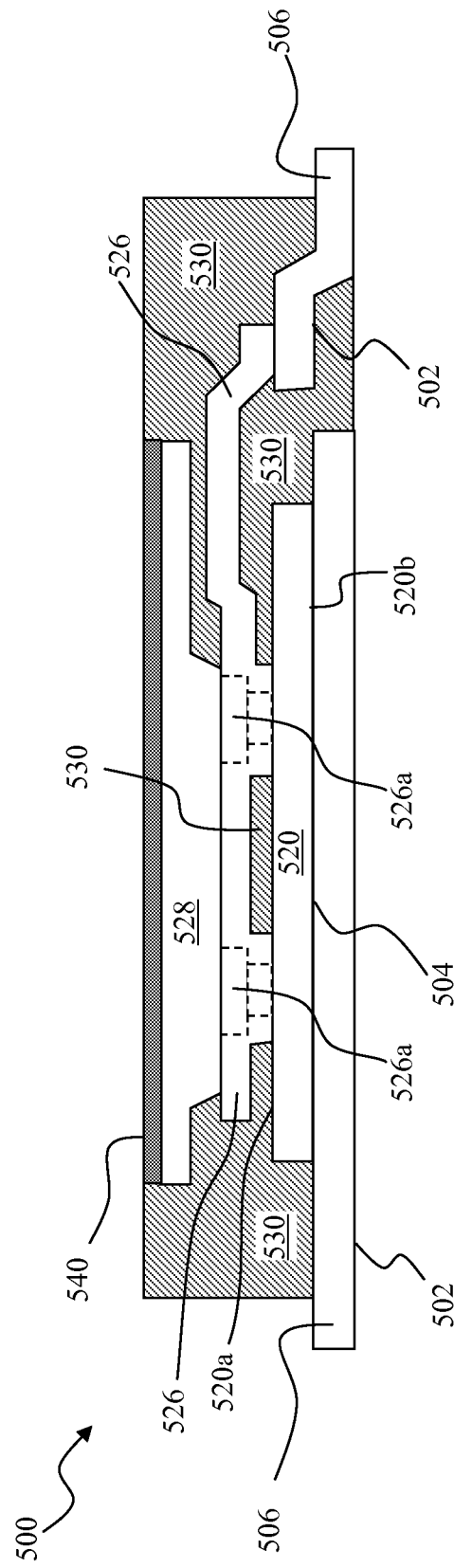
Fig. 11B Present Invention

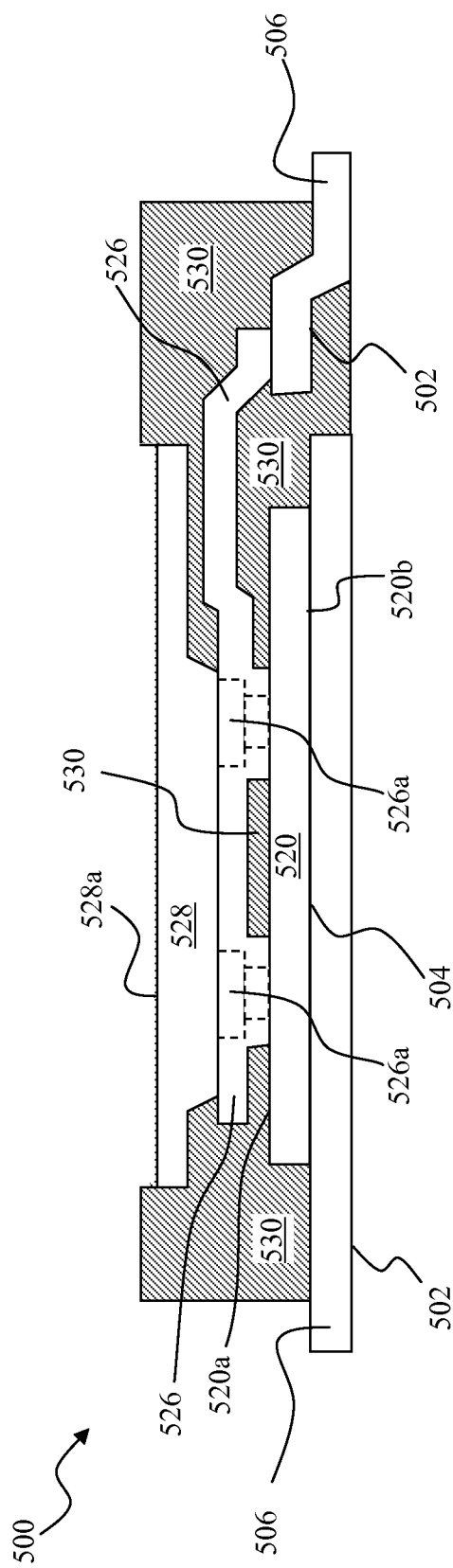
Fig. 11C Present Invention

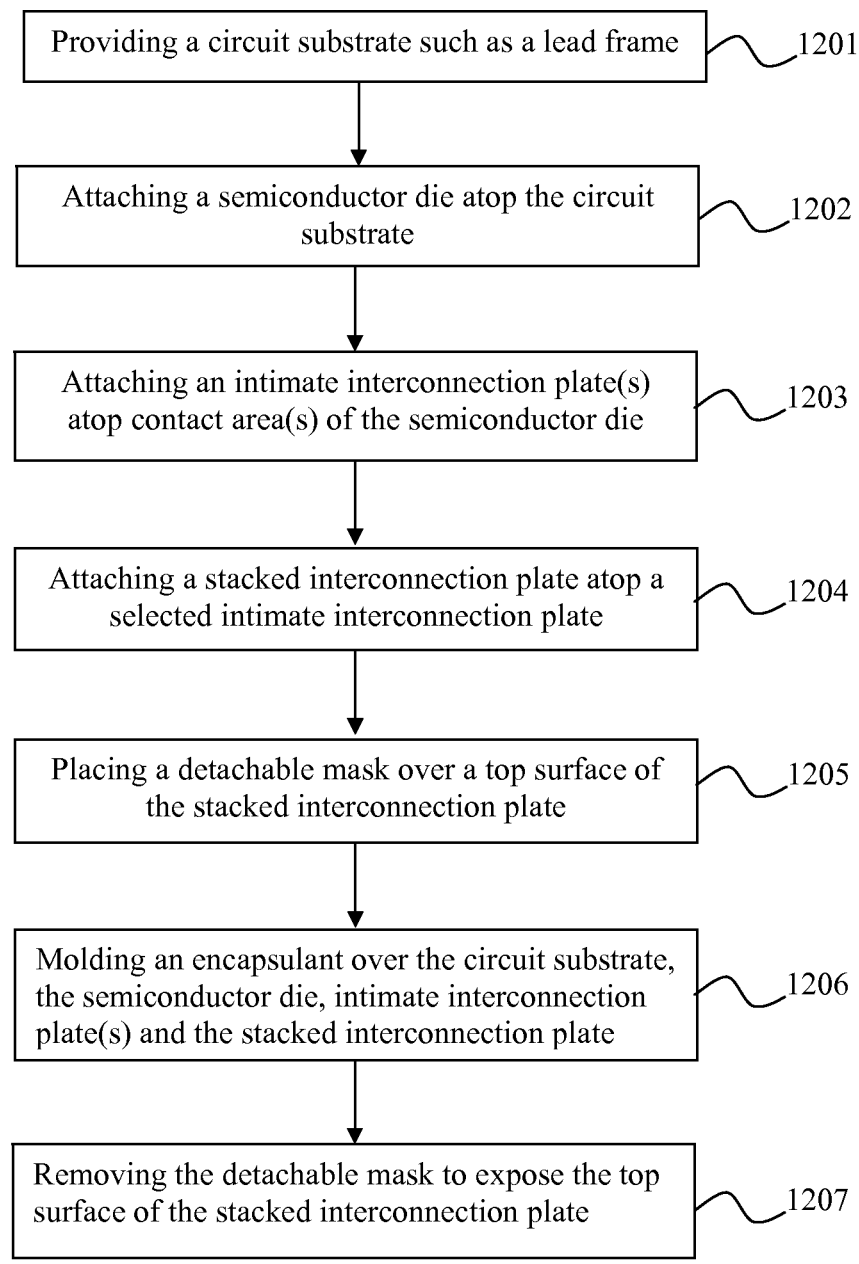
Fig. 12 Present Invention

METHOD FOR TOP-SIDE COOLED SEMICONDUCTOR PACKAGE WITH STACKED INTERCONNECTION PLATES

CROSS REFERENCE TO RELATED APPLICATIONS

This application is a continuation application of a pending U.S patent application entitled "Top-side Cooled Semiconductor Package with Stacked Interconnection Plates and Method" application Ser. No. 13/710,786, filing date: Dec. 11, 2012, inventor Kai Liu et al. The above contents are incorporated herein by reference for any and all purposes.

FIELD OF INVENTION

This invention relates generally to the field of electronic system packaging. More specifically, the present invention is directed to the physical level packaging of semiconductor dies.

BACKGROUND OF THE INVENTION

Owing to their high integration density, extremely low quiescent leakage current and ever improving power handling capacity, power MOSFETs continue their popular adoption in power electronics such as switching power supplies and converters. Some of the highly important attributes of power MOSFETs are their continuously shrinking packaged size and accompanying increased heat dissipation driven by the consumer market.

As a result, power semiconductor device packages with dual side cooling (top and bottom side) are required in many high-power density applications in order to minimize the device operating temperature thus maximize the device and system reliability and efficiency. Bottom side cooling has been achieved by mounting the semiconductor chips on metallic leadframes or heat conductive substrates, or by incorporating thermal vias if laminated circuit substrates are used. The following briefly reviews some prior arts for achieving top side cooling.

In a so-called "DirectFET" approach (U.S. Pat. Nos. 6,624,522, 7,285,866, US Patent Application Publication 2007/0284722), the semiconductor die(s) are required to be mounted upside down inside a metal can such that the backside of die(s) which is typically the drain of a discrete power MOSFET is in electrical contact with a "lid" of the can. The metal can acts like a drain connection to the back of the die, a "lid" as well as a "top side" heat sink for top side cooling. On the other hand, source and gate electrodes on the actual top side of the die are facing down and connected to a circuit board which acts as a bottom heat sink surface. Thus, with the "DirectFET" approach, its external geometrical connections, or package footprint, are not configured to conform to an industry standard package pin out such as, for example, the SO-8 package footprint.

In U.S. Pat. No. 6,777,800 entitled "Semiconductor die package including drain clip", A drain clip having a major surface is electrically coupled to the drain region of the semiconductor die. A non-conductive molding material encapsulates the die. The major surface of the drain clip is exposed through the non-conductive molding material for top side cooling. However, this packaging approach requires a flip-chip configuration that complicates the die packaging process.

The following briefly reviews some prior arts using top side plate bonding with plate exposure for achieving top side cooling while achieving package footprints that conform to an industry standard package pin out.

U.S. application Ser. No. 11/799,467 disclosed a semiconductor package having dimpled plate interconnections. FIG. 17 and FIG. 18 of U.S. application Ser. No. 11/799,467 are respectively reproduced here as FIG. 1A and FIG. 1B and briefly described. Thus, with reference to FIG. 1A and FIG. 1B, a source plate 1700 includes a plurality of dimples 1710 formed thereon. The dimples 1710 are concave with respect to a top surface 1715 of the source plate 1700 and include a through hole 1720 having an opening 1725 formed beyond a plane of a bottom surface 1730 thereof. Similarly, a gate plate 1750 includes a dimple 1760 that is concave with respect to a top surface 1755 of the gate plate 1750 and includes a through hole 1770. This package is compatible with industry standard package pin outs, however this package does not achieve top side cooling.

In U.S. Pat. No. 6,249,041 entitled "IC chip package with directly connected leads" by Kasem et al, hereafter referred to as U.S. Pat. No. 6,249,041, an improved semiconductor device is disclosed that includes a semiconductor chip with contact areas on the top or bottom surface. FIG. 3B of U.S. Pat. No. 6,249,041 is reproduced here and labeled as FIG. 2 and briefly described. A power MOSFET package 41 constructed is shown in cross sectional view. The power MOSFET package 41 has a power MOSFET chip 42a powered by common contact areas. A source contact area and a gate contact area on the top side of chip 42a are each covered with a metallization layer formed from a conductive metal. Likewise, a drain contact area on the bottom side of chip 42a is covered with a metallization layer. A source lead assembly has a contact area 48a in contact with the source contact area on chip 42a. Contact area 48a on source lead assembly is held in contact with source contact area on chip 42a by an electrically conductive adhesive layer 49. Three source leads 48b extend from contact area 48a to provide electrical contact with a printed circuit board. Like source lead assembly, a gate lead assembly also has a contact area in contact with gate contact area on chip 42a. Similarly, a drain lead assembly has a contact area 52a in contact with the drain contact area on the bottom side of chip 42a and four drain leads 52b extending from contact area 52a to provide electrical contact with the printed circuit board. Contact area 52a on drain lead assembly is held in contact with the drain contact area on chip 42a by an electrically conductive adhesive layer 53. A plastic encapsulant 54 encapsulates chip 42a, contact areas 48a and 52a of lead assemblies, and portions of leads 48b and 52b of lead assemblies. Encapsulant 54 provides electrical and thermal insulation of chip 42a from the outside world, as well as giving structural support and rigidity to the power MOSFET package 41. However this package also does not achieve top side cooling.

In U.S. Pat. No. 4,935,803 entitled "Self-centering electrode for power devices" by Kalfus et al, hereafter referred to as U.S. Pat. No. 4,935,803, an improved means and method for forming leads to a power device is disclosed by use of a one-piece leadframe on which the die is mounted and a separate connecting clip between the leadframe and the bonding pad on the semiconductor die. FIG. 4 of U.S. Pat. No. 4,935,803 is reproduced here and labeled as FIG. 3. In cross-sectional view, die 16 having contact region 22 surrounded by raised dielectric 18, is mounted on die flag 13 by attachment means 20. Attachment means 20 may be conductive or insulating, but conductive solder is frequently used when die support 12, 13 is also intended to serve as one of the electrical leads of the device coupled to die 16. Lead 30 is provided extending toward die 16 and is intended to serve as an external connection to die 16. Conveniently located near the end of lead 30, closest to die 16 is alignment means 32, 52. In the example shown, alignment means 32 has the shape of a depression in lead 30 but other shapes such as a protrusion could also be used. In FIG. 3, alignment means 32 has the shape of a substantially hemi-cylindrical groove or other rounded two dimensional shapes whose long dimension extends transverse to the direction from lead 30 toward die 16. While alignment means 32, 42 are shown as being convex downward, they could also be convex upward, i.e., bumps or protrusions rather than depressions. Connection means or clip 40 extends from lead 30 to contact region 22 on die 16. Connection means 40 is attached to lead 30 and die contact 22 by bonding material 36 and 38, respectively. Connection clip or means 40 has alignment means 42 at a first end which mates with alignment means 32 of lead 30 and, at a second end, has attachment means 46 having bottom 48 which is coupled to die contact or bonding pad 22. The shapes of alignment means 42 are such that they engage alignment means 32. The groove shaped depressions of alignment means 32 and 42 permit connection means 40 to move transverse to the direction extending from lead 30 toward die contact 22 on die 16, but restrain movement of clip 40 relative to lead 30 and die contact 22 in the direction toward die contact 22 and restrain horizontal (azimuthal) rotation of connection means 40 relative to lead 30 or bonding pad 22. However, connection means 40 is able to rotate during assembly in the vertical plane. This is desirable since it permits substantial variations in the thickness of die 16 to be accommodated with no change in the leadframe or connection means. This simplifies manufacturing. The configuration shown in FIG. 3 is particularly useful for this purpose because the nested curved surfaces of alignment means 32, 42 form a rotary hinge which permits vertical rotation of connection means 40 relative to lead 30 without substantial change in the spacing of alignment means 32, 42. In this respect it is also desirable that the end of connection means 40 which attaches to bonding pad 22 also be curved, as illustrated by attachment means 46. U.S. Pat. No. 4,935,803 also does not achieve top side cooling.

In US Patent Application 20080087992 entitled "Semiconductor package having a bridged plate interconnection" by Shi Lei et al, hereafter referred to as US 20080087992, a semiconductor package with a bridged source plate interconnection is disclosed for packaging a semiconductor die. FIG. 7 and FIG. 5 of US 20080087992 are reproduced here and respectively labeled as FIG. 4A and FIG. 4B. In FIG. 4A is illustrated a semiconductor package 700 includes a leadframe 705 having a die pad 107, a source contact portion 110 and a gate contact portion 115. A power semiconductor die 120 may have a metalized drain area (not shown) coupled to the die pad 107 by solder reflow. A bridged source plate 130 includes a metal plate stamped or punched to form a bridge portion 131, valley portions 133 on either side of the bridge portion 131, plane portions 135 on either side of the valley portions 133 and the bridge portion 131, and a connection portion 137 depending from one of the plane portions 135. Bridged source plate 130 includes a pair of dimples 710 formed in respective valley portions 133. The dimples 710 are concave with respect to a top surface 720c of the valley portions 133 and have bottom surfaces (not shown) extending beyond a plane of a bottom surface thereof. A gate plate 750 electrically connects the gate contact portion 115 of the gate lead 117 to a gate metalized contact area (not shown) on the power semiconductor die 120. A gate plate dimple 760 is positioned and stamped or punched on the gate plate 750 so as to align with the gate metalized contact of the semiconductor die 120 during solder reflow. The gate plate dimple 760 can optionally include a through hole 770. FIG. 4B illustrates a preferred embodiment of US 20080087992 that is a semiconductor package 500 including a top surface 510 of the bridged source plate bridge portion 131 exposed through an encapsulant 520c. The exposed top surface 510 provides for thermal dissipation of heat generated by the power semiconductor die 120. In addition, the exposed top surface 510 provides an attachment surface for an additional heat sink for additional heat dissipation. Flow of encapsulant material under the bridge portion 131 provides for increased mechanical strength of the package 500.

In a commonly assigned U.S. patent application Ser. No. 12/130,663 with filing date May 30, 2008 and entitled "CONDUCTIVE CLIP FOR SEMICONDUCTOR DEVICE PACKAGE" by Shi Lei et al, hereafter referred to as U.S. application Ser. No. 12/130,663, a semiconductor device package with a conductive clip having separate parallel conductive fingers electrically connected to each other by conductive bridges is disclosed. FIG. 2A and FIG. 2D of U.S. application Ser. No. 12/130,663 are reproduced here and respectively labeled as FIG. 4C and FIG. 4D. FIG. 4C illustrates a semiconductor device package 200 with its gate bond wire replaced with a gate clip 208. The device package 200 includes a fused lead frame 102, a MOS device 114 having top source, top gate and bottom drain located on top of the lead frame 102 and a clip 112 having separate parallel conductive fingers 104 electrically connected to each other by conductive bridges 106. The clip 112 is electrically bonded to the top source of the MOS device 114 only at the bridges 106. The fingers 104 may exhibit a bend out of the plane of the clip 112 in order to vertically contact with the fused source lead 118. In this embodiment, the top gate is electrically connected to the gate lead 110b of the lead frame 102 by a gate clip 208. The top surface of the gate clip 208 and the top surface of the clip 112 are coplanar in this example. FIG. 4D is a perspective view of the semiconductor device package 200 after covered with molding compound 216. As shown in FIG. 4D, the top surface of the clip 112 and the gate clip 208 are exposed.

In a commonly assigned U.S. patent application Ser. No. 12/237,953 with filing date Sep. 24, 2008 and entitled "Top Exposed Clip with Window Array" by Shi Lei et al, hereafter referred to as U.S. application Ser. No. 12/237,953, a semiconductor device package with single stage clips is disclosed. Each single stage clip includes a metal sheet having arrays of windows thereon. FIG. 1A and FIG. 1B of U.S. application Ser. No. 12/237,953 are reproduced here and respectively labeled as FIG. 4E and FIG. 4F. As shown in FIG. 4E, the semiconductor device package 100 includes a fused lead frame 102 and a semiconductor device 104a having contact regions on top and bottom surfaces. By way of example, the semiconductor device 104a may be a vertical metal oxide semiconductor (MOS) device having a top source contact S, a top gate contact G and a bottom drain contact D. In this example, the semiconductor device 104a is located on top of the lead frame 102 with the bottom drain contact D facing and making electrical contact with the main portion of the lead frame 102. By way of example, the lead frame 102 may be fused or non-fused. As an embodiment of U.S. application Ser. No. 12/237,953, the semiconductor device package 100 includes single stage clips 106a, which include two separate metal sheets 108 and 110a having arrays of windows 111 and 113 respectively. Here, metal refers to a material that is thermally and electrically conductive, and preferably is malleable. In metal sheet 108, arrays of conductive fingers, each of which includes a first end and a second end, are formed to make electrical contact with the source contact region S of the semiconductor device 104a at the second end of the conductive finger. The first end of each of the conductive fingers is electrically connected to the metal sheet 108 at each of the corresponding windows 111. This configuration provides for multiple electrically parallel paths that are separated from each other. One or more additional conductive fingers may be formed from a separate metal sheet 110a to provide electrical contact between the gate contact region G of the semiconductor device 104a and gate leads 107a of the lead frame 102. Each of the conductive fingers includes a first end electrically connected to the metal sheet 110a at a window 113 and a second end formed to make electrical contact with the gate contact region G of the semiconductor device 104a. Electrical and mechanical contact between the conductive fingers and contact regions S, G may be established, e.g., through the use of a solder or conductive adhesive. As shown in FIG. 4F, the semiconductor device package 100 may be encapsulated with molding compound 118a and leave the tops of the metal sheets 108, 110a exposed. The exposed area is large and allows for efficient heat dissipation. However, the contact area to the semiconductor device 104a is small.

While the above cited prior arts using top side plate bonding technology with plate exposure do offer numerous advantages like:

Compatibility with industry standard package pin out
Elimination of bond wires thus reducing production cost
Reduction of parasitic inductance and resistance
Lowering package thermal resistance All of them can only achieve limited effectiveness of top side cooling when heat-sinks are put in direct contact with the top of the package due to the limited amount of top metal exposed through the plastic encapsulation compound. Each of them exhibits a trade off between maximizing the top metal exposed for heat dissipation and maximizing the metal connecting the top side die electrodes to leads. More specifically, as the number of top side die electrodes and/or the number of top side plate features of lower elevation (dimples, anchor holes, plane portions, valley portions, conductive bridges between fingers, windows) increase the available area for exposed top surface of each top side plate for heat dissipation correspondingly decreases causing further degradation of effectiveness of top side cooling. Therefore, it remains highly desirable to further enhance the effectiveness of top side cooling while optimizing connection to the semiconductor die and maintaining a semiconductor device packaging footprint that conforms to an industry standard package pin out.

SUMMARY OF THE INVENTION

A top-side cooled semiconductor package with stacked interconnection plates is proposed. The semiconductor package includes:

A circuit substrate having numerous terminal leads for external electrical connection.
At least one semiconductor die whose bottom surface is bonded atop the circuit substrate.
A first number of elevation-adaptive low thermal and electrical resistance intimate interconnection plates for bonding and interconnecting a top contact area of the semiconductor die with the circuit substrate. The intimate interconnection plates are three dimensionally formed to accommodate for elevation difference between the top contact area and the circuit substrate.
A second number of low thermal resistance stacked interconnection plates, each stacked and bonded atop a selected number of intimate interconnection plates, for adding effective top-side cooling to the semiconductor package.
A molding encapsulant for encapsulating most of the semiconductor package except for exposing at least a top surface of at least one stacked interconnection plate through the molding encapsulant to maintain effective top-side cooling.

As a refinement, the periphery of the top surface of at least one stacked interconnection plate is partially etched. The partially etched periphery acts to strengthen the locking of the molding encapsulant to the top of the semiconductor package.

As another refinement, the top portion of at least one stacked interconnection plate includes a peripheral overhang above its correspondingly bonded intimate interconnection plates. The peripheral overhang allows for a maximized exposed top surface area for heat dissipation independent of otherwise areal constraints applicable to the selected number of intimate interconnection plates. The periphery of at least one stacked interconnection plate can be partially etched at its underside to create the peripheral overhang. Alternatively, at least one stacked interconnection plate can be three dimensionally formed to create the peripheral overhang.

As another refinement, each of the selected number of intimate interconnection plates can be shaped and sized, independently of the amount of exposed top surface of its corresponding stacked interconnection plate, to maximize its corresponding bonding areas on the semiconductor die thus reducing their associated spreading resistance.

As another refinement, at least one elevation-adaptive intimate interconnection plate can include numerous locking tabs placed in intermeshing relationship with a corresponding number of terminal leads nearby to minimize rotational creepage of the semiconductor die during a packaging process for the semiconductor package. Likewise, at least one stacked interconnection plate can include numerous locking tabs placed in intermeshing relationship with a corresponding number of terminal leads nearby to minimize rotational creepage of the semiconductor die during packaging as well.

As additional refinements, at least one of the intimate interconnection plates can include:

Numerous dimples for contact with the top metalized contact areas of the semiconductor die.
Numerous anchor holes to facilitate solder paste fill while making contact with the top metalized contact areas of the semiconductor die.

In one embodiment, the circuit substrate can be made of a leadframe. Alternatively, the circuit substrate can be made of a laminated circuit having numerous thermal vias to increase bottom-side cooling.

An alternative top-side cooled semiconductor package with stacked interconnection plates is proposed. The alternative semiconductor package includes:

A circuit substrate having a first plurality of terminal leads for external electrical connection.
A semiconductor die whose bottom surface is bonded atop the circuit substrate.
A first number of elevation-adaptive low thermal and electrical resistance intimate interconnection plates for bonding a top contact area of the semiconductor die and forming a second plurality of terminal leads for external electrical connection while being three dimensionally formed to accommodate for elevation difference between.
A second number of low thermal resistance stacked interconnection plates, each stacked and bonded atop a selected number of intimate interconnection plates, for adding effective top-side cooling to the semiconductor package.

A method of packaging a top-side cooled semiconductor package of a semiconductor die interconnected with numerous elevation-adaptive intimate interconnection plates and elevation-adaptive stacked interconnection plates is proposed. The method includes:

a) Providing a circuit substrate having numerous terminal leads for external electrical connection.
b) Providing the semiconductor die and attaching it atop the circuit substrate.
c) Providing and attaching numerous intimate interconnection plates to the top contact areas of the semiconductor die and the circuit substrate for electrical connection between the top contact areas and the terminal leads.
d) Providing and attaching numerous stacked interconnection plates atop a selected number of intimate interconnection plates.
e) Molding an encapsulant over the package in progress.
f) Removing a top portion of the molding encapsulant till the top surfaces of the stacked interconnection plates are exposed to maintain effective top-side cooling.

As a process variation, the above steps e) and f) can be replaced by:

e) Placing a detachable mask over each top surface of the stacked interconnection plates to be ultimately exposed.
f) Molding an encapsulant over the package in progress.
g) Removing the detachable masks from the package in progress to expose the top surfaces of the stacked interconnection plates to maintain effective top-side cooling.

More generally speaking, the steps e), f) and g) may be replaced by:

e) forming a molding encapsulant over the package in progress such that the top surface of the stacked interconnection plate is exposed to maintain effective top-side cooling.

As a process refinement, the above step d) further includes:

d1) Dispensing a bonding agent atop a selected number of intimate interconnection plates for connecting the stacked interconnection plates with the intimate interconnection plates.
d2) Treating the package in progress to activate the bonding agent thus forming a permanent bond between the stacked interconnection plates and the selected intimate interconnection plates.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. 5A and FIG. 5B illustrate an embodiment of the present invention semiconductor package with an intimate interconnection plate and a stacked interconnection plate having a half etched peripheral overhang;

FIG. 6 illustrates an embodiment of the present invention wherein the stacked interconnection plate is formed to create a peripheral overhang;

FIG. 7 illustrates an embodiment of the present invention wherein a peripheral end of the intimate interconnection plate is made into a plurality of terminal leads;

FIG. 8A to FIG. 8C illustrate an embodiment of the present invention wherein the intimate interconnection plate features dimples and an anchor hole while the stacked interconnection plate features a peripheral overhang and locking tabs;

FIG. 9A and FIG. 9B illustrate an embodiment of the present invention wherein the stacked interconnection plate includes locking tabs and the periphery of the top surface of the stacked interconnection plate is partially etched to strengthen the locking of the molding encapsulant to the semiconductor package;

FIG. 10 illustrates an embodiment of the present invention semiconductor package wherein the circuit substrate is a laminated circuit including a plurality of thermal vias;

FIG. 11A and FIG. 11C illustrate an embodiment of the present invention wherein a detachable mask is placed on top surface of the stacked interconnection plate before a molding encapsulant is formed to cover the semiconductor package; and FIG. 12 is a flow chart illustrating a method of packaging a top-side cooled semiconductor package according to a preferred embodiment of the present invention.

DETAILED DESCRIPTION OF SPECIFIC EMBODIMENTS

Figure 1B:
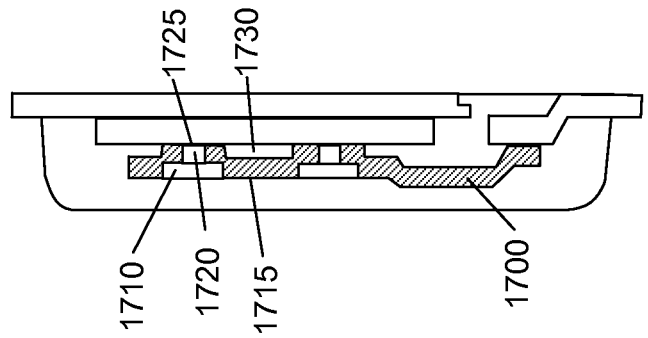
FIG. 1A and FIG. 1B are drawing excerpts from prior art U.S. application Ser. No. 11/799,467.
Figure 1A:
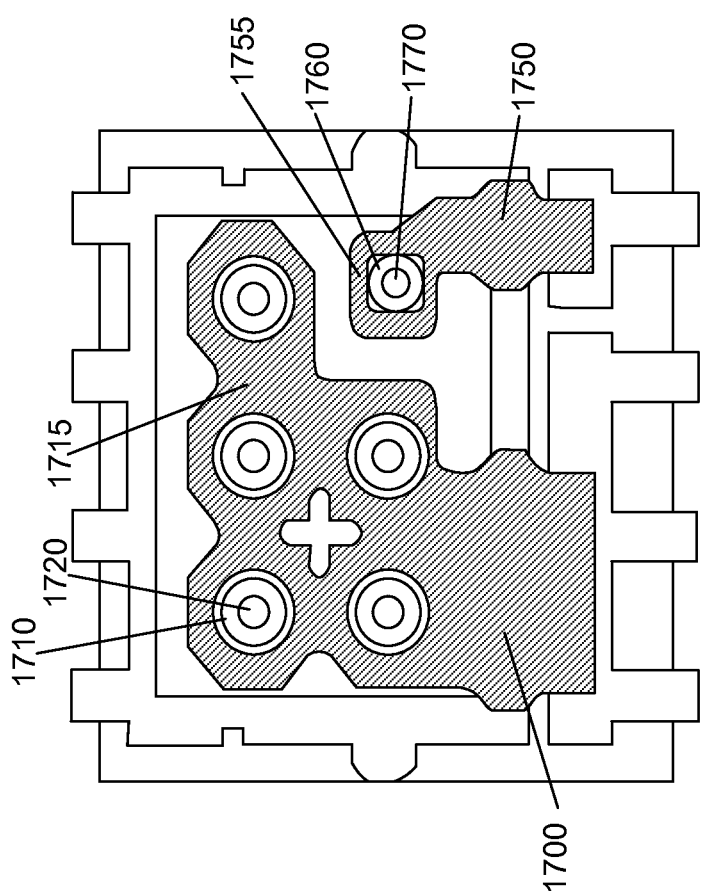
Figure 2:
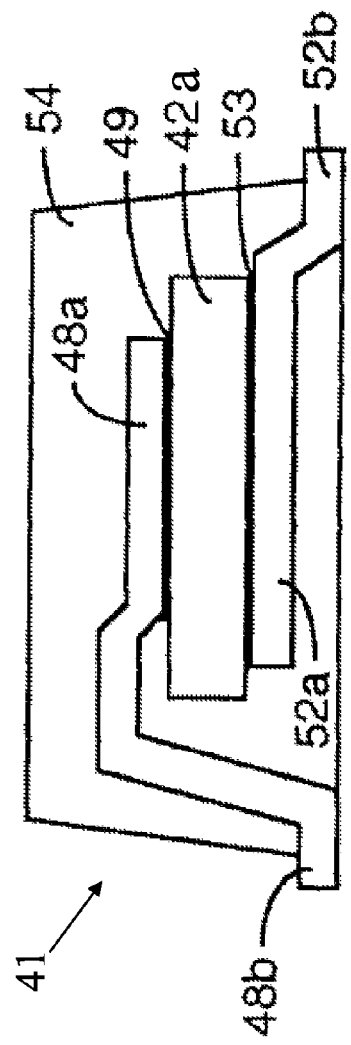
FIG. 2 is a drawing excerpt from prior art U.S. Pat. No. 6,249,041.
Figure 3:
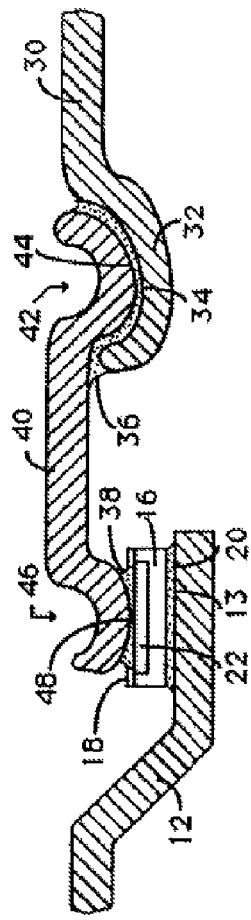
FIG. 3 is a drawing excerpt from prior art U.S. Pat. No. 4,935,803.
Figures 4A, 4B:
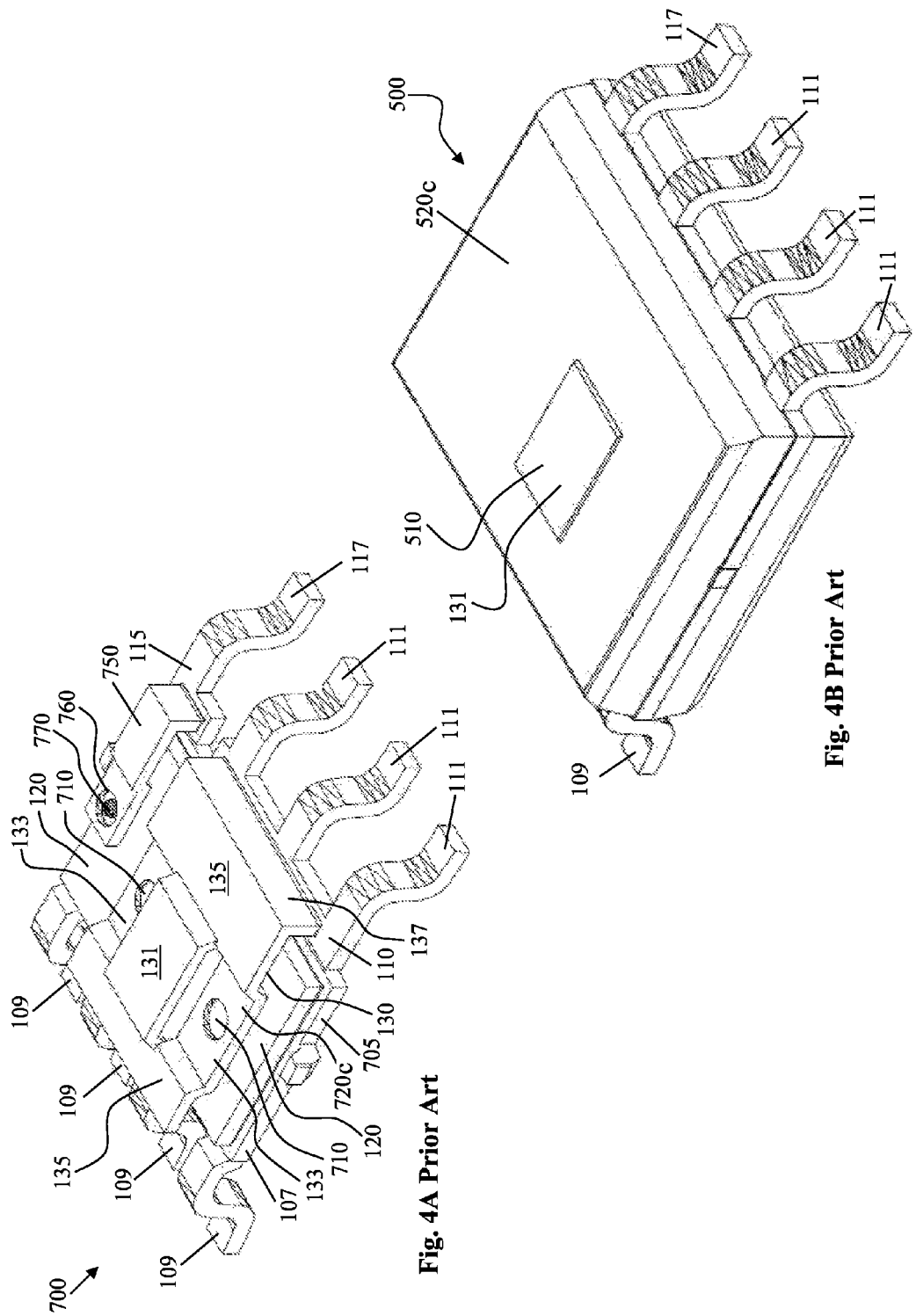
FIG. 4A and FIG. 4B are drawing excerpts from prior art US 20080087992.
Figures 4C, 4D:
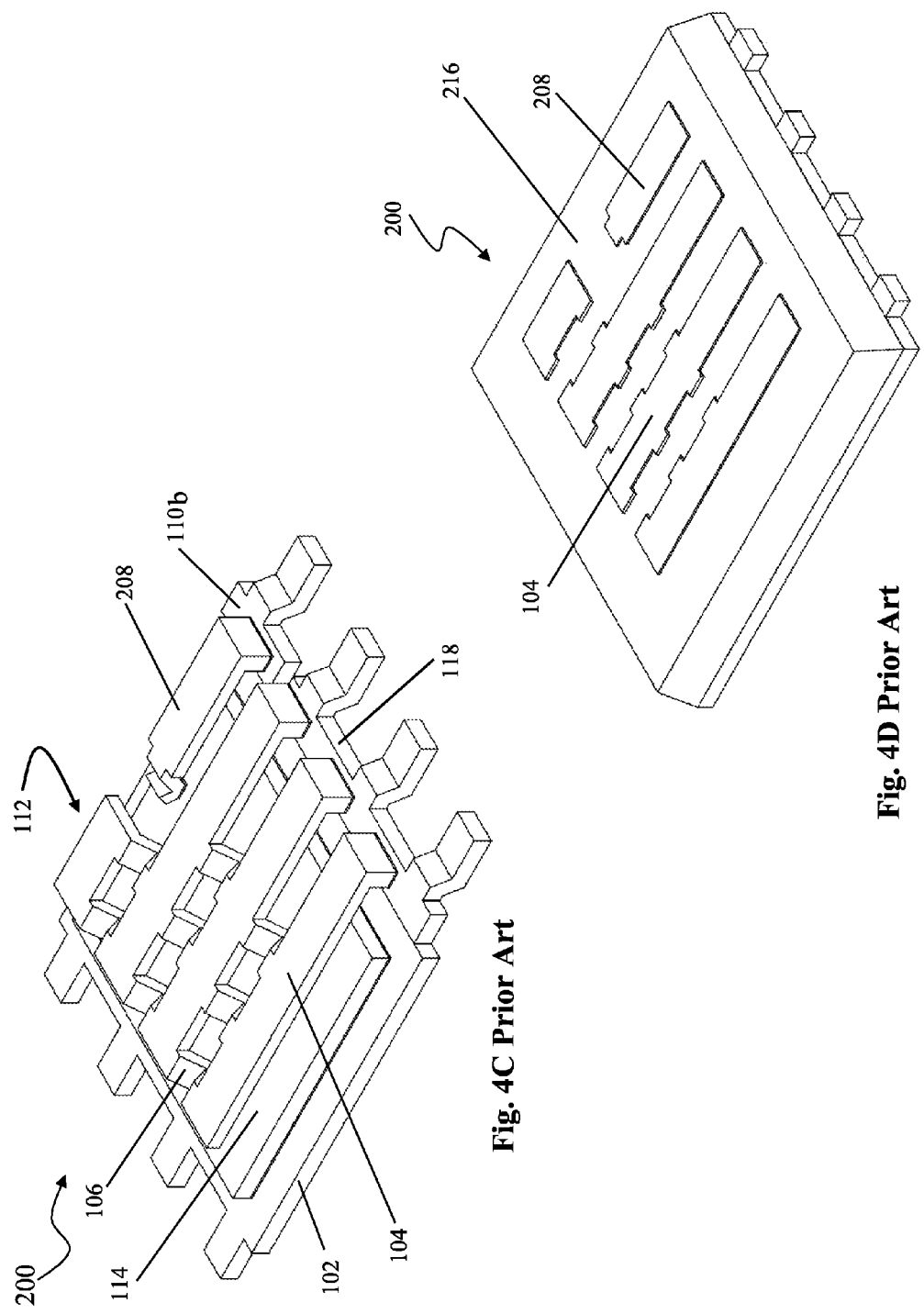
FIG. 4C and FIG. 4D are drawing excerpts from prior art U.S. application Ser. No. 12/130,663.
Figures 4E, 4F:
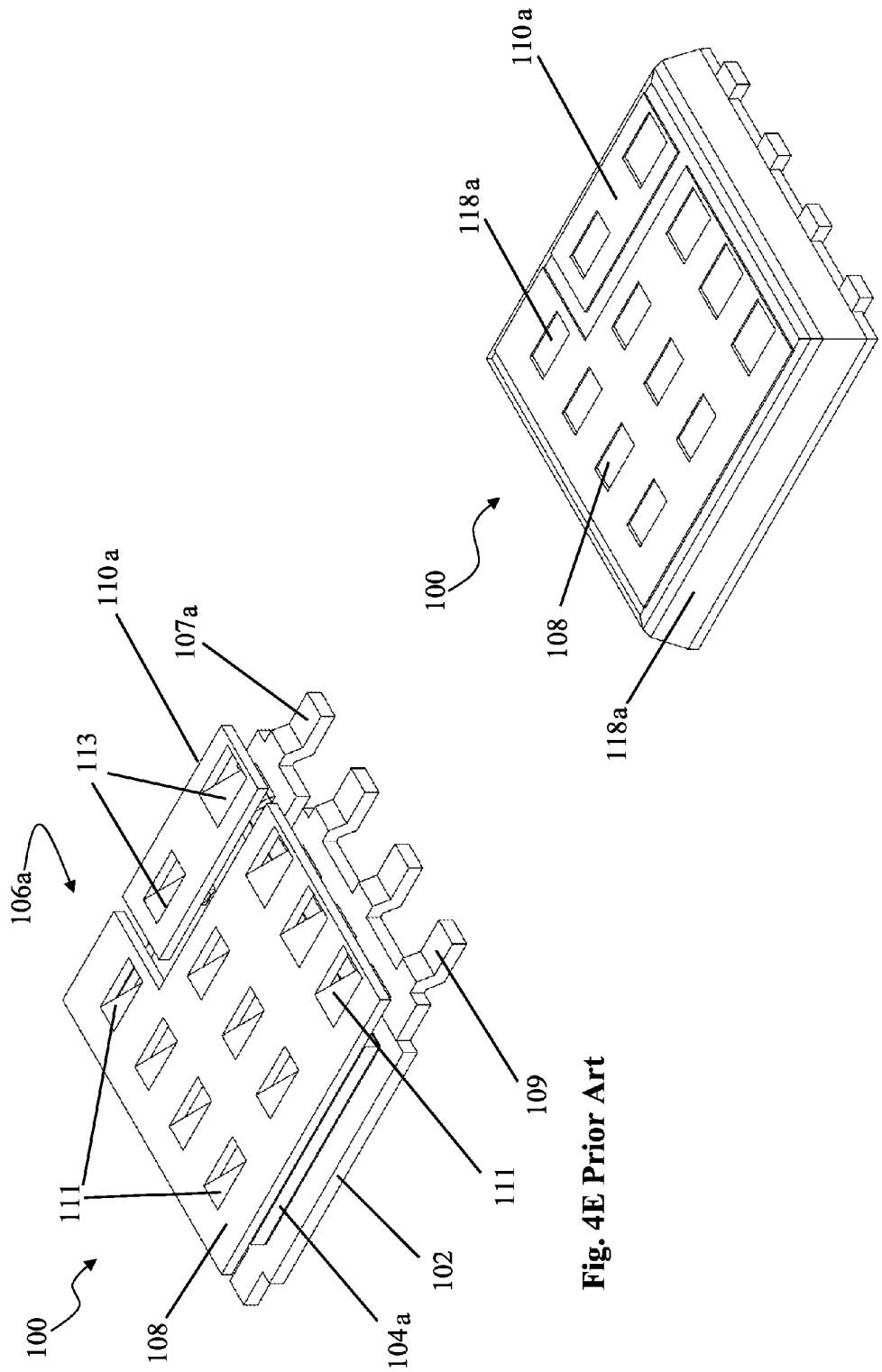
FIG. 4E and FIG. 4F are drawing excerpts from prior art U.S. application Ser. No. 12/237,953.

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

FIG. 5A and FIG. 5B illustrate a top-side cooled semiconductor package 500 having an intimate interconnection plate 526 and a stacked interconnection plate 528. FIG. 5B is a cross sectional view of FIG. 5A along a direction A-A. The top-side cooled semiconductor package 500 includes:

A circuit substrate that is, in this illustrated example, a leadframe 502 having numerous terminal leads 506 for making external electrical connection.

A semiconductor die 520 whose die bottom surface 520$b$ is bonded atop a die pad 504 of the leadframe 502.

An elevation-adaptive low thermal resistance intimate interconnection plate 526 for bonding and interconnecting a top contact area of a die top surface 520$a$ with the leadframe 502. The intimate interconnection plate 526 is three dimensionally formed to accommodate for elevation difference between the top contact area and the leadframe 502 thus making an electrical connection between the top contact area and the terminal leads 506. As illustrated, the intimate interconnection plate 526 may also have dimples 526a for reducing related bonding stress and improving related bonding agent flow.

A low thermal resistance stacked interconnection plate 528, stacked and bonded atop the intimate interconnection plate 526, for adding effective top-side cooling to the semiconductor package 500. The stacking of the flat topped stacked interconnection plate 528 atop the intimate interconnection plate 526 helps to improve manufacturability through reduced sensitivity to tilt, rotation and warpage of the intimate interconnection plate below that could otherwise cause bonding reliability problem between the intimate interconnection plate 526 and top contact areas of the die top surface 520a. Notably, the stacked interconnection plate 528 also has an underside partially etched peripheral overhang 528b that is located above the intimate interconnection plate 526 and additional interconnection plate 524 which can be a gate clip. Alternatively, the gate clip can be replaced with a gate bonding wire. The stacked interconnection plate 528 does not contact the additional interconnection plate 524 due to the peripheral overhang 528b. This allows for a maximized exposed top surface 528a area for heat dissipation independent of otherwise areal constraints applicable to the intimate interconnection plate 526 and other interconnection plate 524 below. In other words, the aforementioned trade off, of cited prior arts, between amount of top metal exposed for heat dissipation and amount of metal contacting the top side die electrodes can be substantially reduced. More specifically under the present invention, as the number of top side die electrodes and/or the number of top side plate features of lower elevation (dimples, anchor holes, plane portions, valley portions, conductive bridges between fingers, windows) increase the available effective exposed top surface area for heat dissipation thus top side cooling will now only decrease by a much lesser degree compared to the cited prior arts. By the same token, the intimate interconnection plates 526 can be shaped and sized, independently of the amount of exposed top surface 528a of the stacked interconnection plate 528 above, to maximize its corresponding bonding areas on the semiconductor die 520 thus reducing its associated spreading resistance. To those skilled in the art, when the intimate interconnection plate 526 and the stacked interconnection plate 528 are also made of high electrical conductivity material such as metal the top-side cooled semiconductor package 500 of the present invention can offer minimized die-to-terminal leads electrical resistance and die-to-ambient thermal resistance at the same time in the presence of increased number of top side die electrodes and plate features of lower elevation.

A molding encapsulant 530 for encapsulating most of the semiconductor package 500 except for exposing a top surface 528a of the stacked interconnection plate 528 through the molding encapsulant 530 to maintain effective top-side cooling. As the stacked interconnection plate 528 with peripheral overhang 528b substantially increases the total contact adhesion area of the molding encapsulant 530, it offers the benefit of improved molding encapsulant adhesion against delamination and increased package moisture resistance against ambient humidity.

FIG. 6 illustrates an embodiment of the present invention wherein a stacked interconnection plate 628 of a top-side cooled semiconductor package 600 is mechanically formed three dimensionally (rather than partially etched) to create a peripheral overhang 628b. In this case, an intimate interconnection plate 626 (with dimples 626a) and a stacked interconnection plate 628 successively contact the die top surface 620a of a semiconductor die 620. The bottom surface 620b of the semiconductor die 620 sits atop a die pad 604 of a leadframe 602. Top surfaces 628a of the stacked interconnection plate 628 and numerous terminal leads 606 are exposed through a molding encapsulant 630. Comparing with the partially etched peripheral overhang 528b, while the mechanically formed peripheral overhang 628b can be easier to make, it nevertheless results in a reduced exposed top surface 628a area for heat dissipation.

FIG. 7 illustrates an embodiment of the present invention wherein a stacked interconnection plate 728 of a top-side cooled semiconductor package 700 is mechanically formed and, as a design variation, a peripheral end of an intimate interconnection plate 726 is formed into numerous terminal leads 706a for external electrical connection. Here, an intimate interconnection plate 726 (with dimples 726a) and a stacked interconnection plate 728 successively contact the die top surface 720a of a semiconductor die 720. The bottom surface 720b of the semiconductor die 720 sits atop a die pad 704 of a leadframe 702. Top surfaces 728a of the stacked interconnection plate 728 and numerous terminal leads 706 are exposed through a molding encapsulant 730. Similarly, although not illustrated here, a peripheral end of a stacked interconnection plate can be formed into terminal leads for external electrical connection as well.

FIG. 8A to FIG. 8C are perspective illustration of a present invention semiconductor package 900 wherein the intimate interconnection plate 926 features dimples 926a and an anchor hole 926b while the stacked interconnection plate 928 features a peripheral overhang 928b and locking tabs 928e and 928f. The anchor hole 926b functions to facilitate solder paste fill for the intimate interconnection plate 926 while making contact with top metalized contact areas of the semiconductor die 920. There may be an additional interconnection plate 924 with a dimple 924a, e.g. a gate clip, to connect another semiconductor region on the semiconductor die 920 to lead 906hThe anchor hole 926b functions to help anchor the intimate interconnection plate 926 in place when the molding compound is added and for stress relief. Notably, the locking tabs 928e and 928f are sized and located on the stacked interconnection plate 928 such that, upon bonding of the stacked interconnection plate 928 onto the intimate interconnection plate 926, they are placed in intermeshing relationship with a corresponding number of terminal leads 906e, 906f and 906g nearby to minimize rotational creepage of the semiconductor die 920 and the intimate interconnection plate 926 during a packaging process for the top-side cooled semiconductor package 900. As to their construction, the locking tabs 928e and 928f can be created on the stacked interconnection plate 928 with mechanical punching and forming of a starting blank plate. To those skilled in the art, the locking tabs can alternatively be created on the intimate interconnection plate 926 to serve a similar purpose as well. As shown in FIG. 8B, the stacked interconnection plate 928 may also have top dimples 928a for locking in place with the dimples 926a of the intimate interconnection plate 926. FIG. 8C illustrates the completed top-side cooled semiconductor package 900 with a molding encapsulant 930, an exposed top surface of the stacked interconnection plate 928 with top dimples 928a and exposed terminal leads 906e, 906f, 906g and 906h.

FIG. 9A and FIG. 9B are perspective illustration of a present invention semiconductor package 1000 wherein the stacked interconnection plate 1028 includes locking tabs 1028e, 1028f intermeshing with terminal leads 1006e, 1006f and 1006g of the leadframe 1002. While not shown here to avoid obscuring details, additional locking tabs can be created on the intimate interconnection plate 1026 to intermesh with terminal leads 1006e, 1006f, and 1006g of the leadframe 1002 as well. The intimate interconnection plate electrically connects the top of the semiconductor die 1020 to the terminal leads 1006e, 1006f, and 1006g. Notice that the periphery of the top surface of the stacked interconnection plate 1028 is partially etched to create numerous partially etched ledges 1028k. These partially etched ledges 1028k function to strengthen the locking of a molding encapsulant 1030 to the semiconductor package 1000. An additional interconnection plate 1024 may connect to terminal lead 1006. By way of example the additional interconnection plate 1024 may be a gate clip for connecting a gate region on the semiconductor die to a gate lead. FIG. 9B illustrates the completed top-side cooled semiconductor package 1000 with the molding encapsulant 1030, an exposed top surface of the stacked interconnection plate 1028 for heat dissipation and exposed terminal leads 1006 (FIG. 9A), 1006e, 1006f, 1006g and 1006h for external electrical connection.

By now it should become clear to those skilled in the art that, within the context of the present invention, the circuit substrate, instead of being a leadframe, can be a laminated circuit 503 having numerous terminal leads for making external electrical connection as shown in FIG. 10. However, to insure effective bottom-side heat dissipation, the laminated circuit should include a plurality of thermal vias 542. To minimize die-to-terminal leads electrical resistance and die-to-ambient thermal resistance, the intimate interconnection plate should be made of thermally and electrically conductive material. The stacked interconnection plate should be made of thermally conductive or thermally and electrically conductive material. Also, the top-side cooled semiconductor package also expects to work for a normal (substrate down) or flip chip (substrate up) die orientation atop the circuit substrate. Additionally, whether the circuit substrate is made of a leadframe or a laminated circuit, the numerous features of the present invention semiconductor package as described above can all be embodied in a corresponding package pin out geometry that is compatible with an industry standard package pin out such as Small Outline Integrated Circuit (SOIC), Dual Flat No-lead (DFN), Quad Flat No-lead (QFN), Micro Leadless Package (MLP) or Transistor Outline (TO) series).

With reference made to FIG. 5A and FIG. 5B as an illustrative example, as shown in FIG. 12, a method of packaging the top-side cooled semiconductor package 500 includes:
  a) Provide a leadframe 502 with terminal leads 506 for external connection (step 1201). To implement a package pin out geometry that is compatible with an industry standard, for example, an industry standard pin out lead frame should be used here. A bonding agent is then dispensed atop the leadframe die pad 504 and terminal leads 506. The bonding agent can be made of a solder paste, a thermal and/or electrically conductive epoxy, etc. and it can be thermally or UV (ultra violet) cured.
  b) Provide a semiconductor die 520 and attach it atop the leadframe 502 (step 1202). More specifically, the semiconductor die 520 can be attached to the leadframe 502 via solder attach as in a standard die attachment procedure. Solderable top metal should be used on the semiconductor die 520. For example, exposed Aluminum in the source and gate pad regions of a MOSFET die should be electrolessly plated with NiAu.
  c) Provide and attach an intimate interconnection plate 526 to the top contact areas of the semiconductor die 520 and the leadframe 502 for electrical connection between the top contact areas and the terminal leads 506 (step 1203). More specifically, the intimate interconnection plate 526 can be attached to the semiconductor die 520 via solder die attach. A bonding agent 531 is then dispensed atop the intimate interconnection plate 526.
  d) Provide and attach a stacked interconnection plate 528 atop the intimate interconnection plate 526 (step 1204). More specifically, the stacked interconnection plate 528 can be attached to the intimate interconnection plate 526 via solder attach. As an alternative, an electrically and thermally conductive epoxy can be used to attach the stacked interconnection plate 528 to the intimate interconnection plate 526. The package in progress is then treated to activate the various bonding agents thus forming a permanent bond between the stacked interconnection plate 528 and the intimate interconnection plate 526. The package treatment can involve using heat, UV, etc. to reflow a solder paste or to cure an epoxy.
  e) Forming a molding encapsulant 530 over the package in progress such that the top surface 528a of the stacked interconnection plate 528 is exposed to maintain effective top-side cooling.

By way of example, step e) may be carried out by:
  e1) Mold a molding encapsulant 530 over the package in progress.
  e2) Remove a top portion of the molding encapsulant 530 till the top surface 528a of the stacked interconnection plate 528 is exposed to maintain effective top-side cooling. More specifically, mechanical grinding can be employed for the removal.

Subsequent additional miscellaneous package finishing steps like lead finishing by plating, package marking and lead trimming are not detailed here. As a process variation, shown in FIGS. 11A-11C, the above steps e1) and e2) can be replaced by:
  e1) Place a detachable mask 540 over the top surface 528a of the stacked interconnection plate 528 to be ultimately exposed (step 1205).
  e2) Mold a molding encapsulant 530 over the package in progress (step 1206).
  e3) Remove the detachable mask from the package in progress to expose the top surface 528a of the stacked interconnection plate 528 to maintain effective top-side cooling (step 1207).

A top-side cooled semiconductor package with an intimate interconnection plate and a stacked interconnection plate has been described for minimizing die-to-terminal electrical resistance and die-to-ambient thermal resistance at the same time in the presence of multiple top side die electrodes and plate features of lower elevation. By now it should become clear to those skilled in the art that the numerous embodiments just described can be readily modified to suit other specific applications as well. While the description above contains many specificities, these specificities should not be constructed as accordingly limiting the scope of the present invention but as merely providing illustrations of numerous presently preferred embodiments of this invention. For example, the present invention semiconductor package system expects to be applicable to the co-packaging of multiple semiconductor dies such as a high-side FET die and a low-side FET die for use in a power converter circuit. For another example, the present invention expects to be applicable to the packaging of a wide variety of semiconductor dies other than just MOSFET dies as disclosed herein. These semiconductor dies include IGBT and dies made of SiGe, SiC, GaAs and GaN. For another example, the same inventive concept of the present invention can be extended to employ multiple intimate interconnection plates and multiple stacked interconnection plates. For yet another example, the present invention can be extended to employ multiple layers of stacked interconnection plate as well.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

What is claimed are:

1. A method of packaging a top-side cooled semiconductor package of a semiconductor die interconnected with a plurality of elevation-adaptive conductive intimate interconnection plates and elevation-adaptive conductive stacked interconnection plates, the method comprising the steps of:
    a) providing a circuit substrate having a plurality of terminal leads for external electrical connection;
    b) providing the semiconductor die and attaching it atop the circuit substrate;
    c) providing and attaching one or more intimate interconnection plates to top contact areas of said semiconductor die and said circuit substrate for electrical connection between said top contact areas and said terminal leads;
    d) providing and attaching a number of stacked interconnection plates atop a selected intimate interconnection plate;
    e1) placing a detachable mask over a top surface of the number of stacked interconnection plates to be ultimately exposed;
    e2) molding an encapsulant over the circuit substrate, the semiconductor die and the one or more intimate interconnection plates and enclosing a majority portion of each of the number of stacked interconnection plates; and
    e3) removing the detachable mask to expose the top surface of the number of stacked interconnection plates to maintain effective top-side cooling.

2. The method of claim 1 wherein said circuit substrate is a leadframe having die pads and the step of providing the circuit substrate further comprises dispensing a bonding agent atop the leadframe die pads and the plurality of terminal leads.

3. The method of claim 1 wherein the step of providing and attaching the number of stacked interconnection plates comprising the sub-steps of:
    d1) dispensing a conductive bonding agent atop the selected intimate interconnection plate for connecting the number of stacked interconnection plates with the selected intimate interconnection plate; and
    d2) treating the package in progress to activate the conductive bonding agent thus forming a permanent bond between the number of stacked interconnection plates and the selected intimate interconnection plate.

* * * * *